(12) United States Patent
Järvinen

(10) Patent No.: US 9,282,279 B2
(45) Date of Patent: Mar. 8, 2016

(54) QUALITY ENHANCEMENT IN MULTIMEDIA CAPTURING

(75) Inventor: Kari Järvinen, Tampere (FI)

(73) Assignee: Nokia Technologies Oy, Espoo (FI)

( * ) Notice: Subject to any disclaimer, the term of this patent is extended or adjusted under 35 U.S.C. 154(b) by 83 days.

(21) Appl. No.: 14/358,760

(22) PCT Filed: Nov. 30, 2011

(86) PCT No.: PCT/FI2011/051063
§ 371 (c)(1),
(2), (4) Date: May 16, 2014

(87) PCT Pub. No.: WO2013/079763
PCT Pub. Date: Jun. 6, 2013

(65) Prior Publication Data
US 2014/0308025 A1    Oct. 16, 2014

(51) Int. Cl.
| | | |
|---|---|---|
| H04N 9/80 | (2006.01) | |
| H04N 5/93 | (2006.01) | |
| H04N 5/91 | (2006.01) | |
| H04N 9/806 | (2006.01) | |
| H04N 5/77 | (2006.01) | |

(Continued)

(52) U.S. Cl.
CPC ............ *H04N 5/91* (2013.01); *H04N 5/772* (2013.01); *H04N 9/806* (2013.01); *H04N 9/8042* (2013.01); *H04N 9/8211* (2013.01); *H04N 19/85* (2014.11); *H03G 3/002* (2013.01); *H03G 3/3005* (2013.01); *H04N 21/4223* (2013.01); *H04N 21/439* (2013.01); *H04N 21/44218* (2013.01)

(58) Field of Classification Search
CPC ....... H04N 5/772; H04N 5/91; H04N 9/8042; H04N 9/806; H04N 9/8211
USPC ......... 386/248, 239, 278, 285, 326, 338, 339, 386/340
See application file for complete search history.

(56) References Cited

U.S. PATENT DOCUMENTS

| | | |
|---|---|---|
| 7,171,246 B2 | 1/2007 | Mattila et al. |
| 7,206,418 B2 | 4/2007 | Yang et al. |

(Continued)

FOREIGN PATENT DOCUMENTS

| | | |
|---|---|---|
| EP | 1232496 B1 | 1/2007 |
| EP | 2031905 A2 | 3/2009 |

(Continued)

OTHER PUBLICATIONS

"3rd Generation Partnership Project; Technical Specification Group Services and System Aspects; Packet Switched Conversational Multimedia Applications; Default Codecs (Release 10)", 3GPP TS 26.235, v10.0.0, Mar. 2011, pp. 1-16.

(Continued)

*Primary Examiner* — Robert Chevalier
(74) *Attorney, Agent, or Firm* — Nokia Technologies Oy

(57) ABSTRACT

A method for controlling capturing of multimedia content, the method comprising: capturing multimedia content by an apparatus, said multimedia content comprising at least an audio signal and a video signal; obtaining control information based on at least either of said audio signal or video signal; controlling pre-processing of the audio signal based on the control information obtained from the video signal; and/or controlling pre-processing of the video signal based on the control information obtained from the audio signal.

20 Claims, 6 Drawing Sheets

(51) Int. Cl.
*H04N 9/804* (2006.01)
*H04N 9/82* (2006.01)
*H04N 19/85* (2014.01)
*H03G 3/30* (2006.01)
*H04N 21/4223* (2011.01)
*H04N 21/439* (2011.01)
*H04N 21/442* (2011.01)
*H03G 3/00* (2006.01)

(56) References Cited

U.S. PATENT DOCUMENTS

| | | | |
|---|---|---|---|
| 2009/0087161 | A1 | 4/2009 | Roberts et al. |
| 2011/0063405 | A1 | 3/2011 | Yam |
| 2011/0122275 | A1 | 5/2011 | Kawai et al. |
| 2011/0257971 | A1 | 10/2011 | Morrison |
| 2013/0077932 | A1* | 3/2013 | Cornell ............... H04N 5/232 386/227 |

FOREIGN PATENT DOCUMENTS

| | | | |
|---|---|---|---|
| JP | 2000201232 | | 7/2000 |
| KR | 100964663 | B1 * | 6/2010 |
| WO | 2009/031979 | A1 | 3/2009 |
| WO | 2011/091593 | A1 | 8/2011 |

OTHER PUBLICATIONS

"3rd Generation Partnership Project; Technical Specification Group Services and System Aspects; Codec for Circuit Switched Multimedia Telephony Service; General Description (Release 10)", 3GPP TS 26.110, v10.0.0, Mar. 2011, pp. 1-14.

"3rd Generation Partnership Project; Technical Specification Group Services and System Aspects; IP Multimedia Subsystem (IMS); Multimedia Telephony; Media handling and interaction (Release 11)", 3GPP TS 26.114, v11.1.0, Sep. 2011, pp. 1-250.

"Video Codec for Audiovisual Services at p x 64 kbits", Line Transmission of Non—Telephone Signals, Recommendation ITU-T H.261, Mar. 1993, 29 pages.

"InformationTechnology—Generic Coding of Moving Pictures and Associated Audio Information: Video", Series H: Audiovisual and Multimedia Systems, Infrastructure of audiovisual services—Coding of moving video, Recommendation ITUT-T H.262, Feb. 2000, 220 pages.

"Video Coding for Low Bit Rate Communication", Series H: Audiovisual and Multimedia Systems, Infrastructure of audiovisual services—Coding of moving video, Recommendation ITU-T H.263, Jan. 2005, 226 pages.

"Advanced Video Coding for Generic Audiovisual Services", Series H: Audiovisual and Multimedia Systems, Infrastructure of audiovisual services—Coding of moving video, Recommendation ITU-T H.264, Mar. 2010, 676 pages.

"High Efficiency Video Coding", Series H: Audiovisual and Multimedia Systems, Infrastructure of audiovisual services—Coding of moving video, Recommendation ITU-T H.265, Apr. 2013, 317 pages.

Eronen et al., "Audio-Based Context Recognition", IEEE Transactions on Audio, Speech, and Language Processing, vol. 14, Issue: 1, Jan. 2006, pp. 321-329.

"Voicecam", Fraunhofer IDMT, Retrieved on Sep. 24, 2014, Webpage available at : http://www.idmt.fraunhofer.de/de/Service_Offerings/products_and_technologies/u_z/voicecam.html.

International Search Report and Written Opinion received for corresponding Patent Cooperation Treaty Application No. PCT/FI2011/051063, dated Oct. 29, 2012, 10 pages.

Extended European Search Report received for corresponding European Patent Application No. 11876446.3, dated Sep. 11, 2015, 8 pages.

* cited by examiner

QUALITY ENHANCEMENT IN MULTIMEDIA CAPTURING

RELATED APPLICATION

This application was originally filed as PCT Application No. PCT/FI2011/051063 filed Nov. 30, 2011.

BACKGROUND

Multimedia capturing capabilities have become common features in portable devices. A multimedia call between two or more attendants may comprise simultaneous transmission of both audio and video signal. On the other hand, many people tend to record or capture audio and video content in an event, such as a music concert or a sport event, they are attending.

Background noise causes challenges for audio coding and for the overall quality-of-experience in mobile multimedia communications. Multimedia terminals are often used in surroundings with high background noise levels making the multimedia capturing vulnerable to background noise. In order to improve audio quality, multimedia terminals typically apply noise suppression (a.k.a. noise cancellation) as a pre-processing step before the voice signal is subjected to audio encoding. The noise suppression can never perfectly distinguish between the voice and the background noise, and therefore, a noise suppressor is typically designed to provide a fixed trade-off between attenuating background noise as much as possible and causing as little degradation as possible for the voice signal itself.

However, a straightforward application of such fixed trade-off between these two is not optimal. For example, in some multimedia capturing it is desirable that also the ambience is conveyed as well as possible (e.g. when being in a live music concert) while in others (e.g. when trying to explain an important issue in high-noise environment) all background noise will reduce the clarity and intelligibility of voice and is hence unwanted. In other words, what should be considered as unwanted "background noise" depends on the context of the multimedia capturing session. Furthermore, a user of the multimedia terminal has no means to adjust the noise suppression or any other pre-processing to be more optimal for a particular multimedia capturing session.

SUMMARY

Now there has been invented an improved method and technical equipment implementing the method for alleviating the above problems. Various aspects of the invention include a method, an apparatus and a computer program product, which are characterized by what is stated in the independent claims. Various embodiments of the invention are disclosed in the dependent claims.

According to a first aspect, there is provided a method comprising: capturing multimedia content by an apparatus, said multimedia content comprising at least an audio signal and a video signal; obtaining control information based on at least either of said audio signal or video signal; controlling pre-processing of the audio signal based on the control information obtained from the video signal; and/or controlling pre-processing of the video signal based on the control information obtained from the audio signal.

According to an embodiment, the method further comprises applying the pre-processing prior to encoding said audio signal or video signal.

According to an embodiment, the pre-processing of the audio signal is one of the following: noise suppression, voice level adjustment, adjustment of dynamic range of voice, directing a microphone beamform of a multi-microphone arrangement towards an audio source.

According to an embodiment, the method further comprises determining a priority value for at least one audio source appearing on a video scene represented by the video signal in proportion to an image area covered by the audio source in said video scene; and adjusting the pre-processing of the audio signal according to the priority value such that an audio component originating from an audio source covering largest image area of the video scene is emphasized in the pre-processing.

According to an embodiment, the method further comprises determining a priority value for at least one audio source appearing on a video scene represented by the video signal in proportion to an image area covered by the audio source in said video scene; and adjusting the pre-processing of the audio signal according to the priority value such that an audio component contributing less to an overall video scene is de-emphasized in the pre-processing.

According to an embodiment, the method further comprises detecting at least a part of a human face in a video scene represented by the video signal; and adjusting the pre-processing of the audio signal in proportion to an image area covered by the human face in said video scene.

According to an embodiment, said pre-processing of the audio signal is noise suppression, and the method further comprises adjusting attenuation of background noise in proportion to the image area covered by the human face in said video scene.

According to an embodiment, the method further comprises obtaining control information for the audio pre-processor control signal from a plurality of points of a processing chain of the video signal, said plurality of points being located in at least one of the following points: prior to video signal pre-processing, prior to video signal encoding, during video encoding and the encoded parameter values of the video signal.

According to an embodiment, the pre-processing of the video signal is one of the following: smoothening details of image frames, adjustment of dynamic range of colours, reducing a colour gamut of the video signal or removing less essential parts of the video signal.

According to an embodiment, the method further comprises determining a priority value for at least one object appearing on a video scene represented by the video signal in proportion to an audio component contributed by said object to an overall audio scene; and adjusting the pre-processing of the video signal according to the priority value such that an object contributing less to an overall audio scene is de-emphasized in the pre-processing.

According to an embodiment, the method further comprises obtaining control information for the video pre-processor control signal from a plurality of points of a processing chain of the audio signal, said plurality of points being located in at least one of the following points: prior to audio signal pre-processing, prior to audio signal encoding, during audio encoding and the encoded parameter values of the audio signal.

According to a second aspect, there is provided an apparatus comprising at least one processor, memory including computer program code, the memory and the computer program code configured to, with the at least one processor, cause the apparatus to at least: capture multimedia content, said multimedia content comprising at least an audio signal and a video signal; obtain control information based on at least either of said audio signal or video signal; control pre-processing of the audio signal based on the control information obtained from the video signal; and/or control pre-processing of the video signal based on the control information obtained from the audio signal.

According to a third aspect, there is provided a computer readable storage medium stored with code thereon for use by an apparatus, which when executed by a processor, causes the apparatus to perform: capturing multimedia content, said multimedia content comprising at least an audio signal and a video signal; obtaining control information based on at least either of said audio signal or video signal; controlling pre-processing of the audio signal based on the control information obtained from the video signal; and/or controlling pre-processing of the video signal based on the control information obtained from the audio signal.

These and other aspects of the invention and the embodiments related thereto will become apparent in view of the detailed disclosure of the embodiments further below.

LIST OF DRAWINGS

In the following, various embodiments of the invention will be described in more detail with reference to the appended drawings, in which FIG. 1 shows a schematic block diagram of an exemplary apparatus suitable to be used in multimedia capturing according to an embodiment;

DESCRIPTION OF EMBODIMENTS

Figure 1:
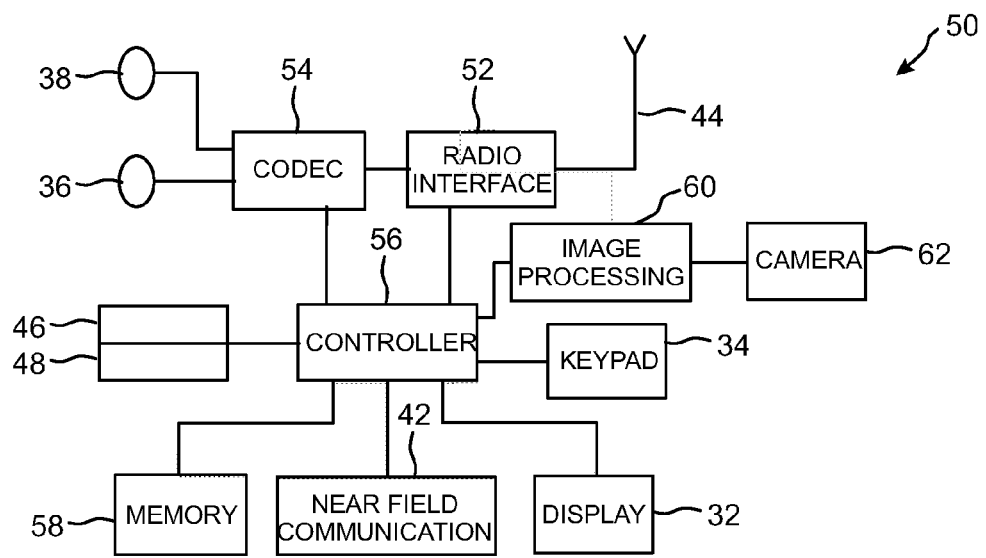
Figure 2:
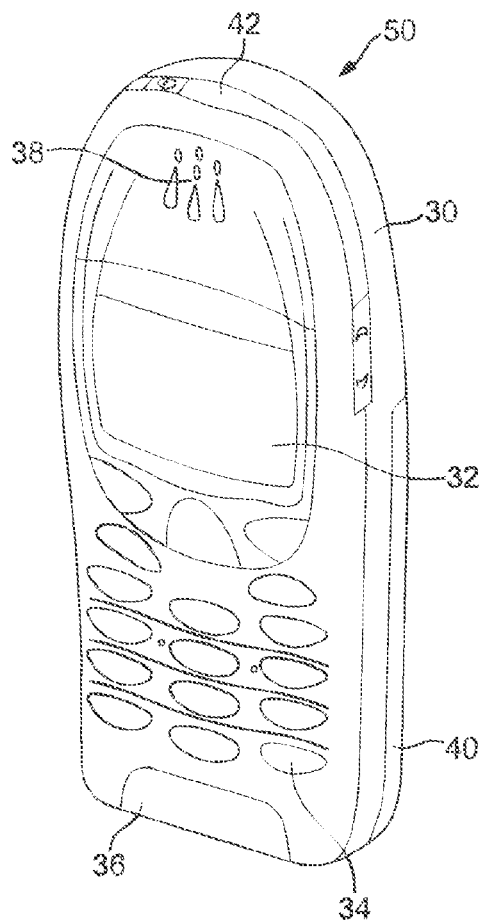
FIG. 2 shows another view of the exemplary apparatus of FIG. 1.

The following describes in further detail suitable apparatuses and possible mechanisms for implementing an improving voice and video quality in multimedia communications. In this regard reference is first made to FIGS. 1 and 2 which shows a schematic block diagram of an exemplary apparatus or electronic device 50, which may incorporate necessary functions for the multimedia according to an embodiment of the invention.

The electronic device 50 may be, for example, a mobile terminal or user equipment of a wireless communication system, a digital camera, a laptop computer etc. However, it would be appreciated that embodiments of the invention may be implemented within any electronic device or apparatus which may contain multimedia processing properties.

The apparatus 50 may comprise a housing 30 (FIG. 2) for incorporating and protecting the device. The apparatus 50 further may comprise a display 32 in the form of a liquid crystal display. In other embodiments of the invention the display may be any suitable display technology suitable to display an image or video. In some embodiments the display 32 may be a touch-sensitive display meaning that, in addition to be able to display information, the display 32 is also able to sense touches on the display 32 and deliver information regarding the touch, e.g. the location of the touch, the force of the touch etc. to the controller 56. Hence, the touch-sensitive display can also be used as means for inputting information. In an example embodiment the touch-sensitive display 32 may be implemented as a display element and a touch-sensitive element located above the display element.

The apparatus 50 may further comprise a keypad 34. In other embodiments of the invention any suitable data or user interface mechanism may be employed. For example, the user interface may be implemented as a virtual keyboard or data entry system as part of a touch-sensitive display or it may contain speech recognition capabilities. The apparatus may comprise a microphone 36 or any suitable audio input which may be a digital or analogue signal input. The apparatus 50 may further comprise an audio output device which in embodiments of the invention may be any one of: an earpiece 38, speaker, or an analogue audio or digital audio output connection. The apparatus 50 may also comprise a battery 40 (or in other embodiments of the invention the device may be powered by any suitable mobile energy device such as solar cell, fuel cell or clockwork generator). The apparatus may further comprise a near field communication (NFC) connection 42 for short range communication to other devices, e.g. for distances from a few centimeters to few meters or to tens of meters. In other embodiments the apparatus 50 may further comprise any suitable short range communication solution such as for example a Bluetooth wireless connection, an infrared port or a USB/firewire wired connection.

The apparatus 50 may comprise a controller 56 or processor for controlling the apparatus 50. The controller 56 may be connected to memory 58 which in embodiments of the invention may store both data in the form of image and audio data and/or may also store instructions for implementation on the controller 56. The controller 56 may further be connected to a codec circuitry 54 suitable for carrying out coding and decoding of audio and/or video data or assisting in coding and decoding carried out by the controller 56.

The apparatus 50 may further comprise a card reader 48 and a smart card 46, for example a UICC and UICC reader for providing user information and being suitable for providing authentication information for authentication and authorization of the user at a network.

The apparatus 50 may comprise radio interface circuitry 52 connected to the controller and suitable for generating wireless communication signals for example for communication with a cellular communications network, a wireless communications system and/or a wireless local area network. The apparatus 50 may further comprise an antenna 44 connected to the radio interface circuitry 52 for transmitting radio frequency signals generated at the radio interface circuitry 52 to other apparatus(es) and for receiving radio frequency signals from other apparatus(es).

In some embodiments, the apparatus 50 may comprise a camera 62 capable of recording or detecting individual frames or images which are then passed to an image processing circuitry 60 or controller 56 for processing. In further embodiments, the apparatus may receive the image data from another device prior to transmission and/or storage. In further embodiments, the apparatus 50 may receive the image for coding/decoding either wirelessly or by a wired connection e.g. from a remote camera unit.

Figure 3:
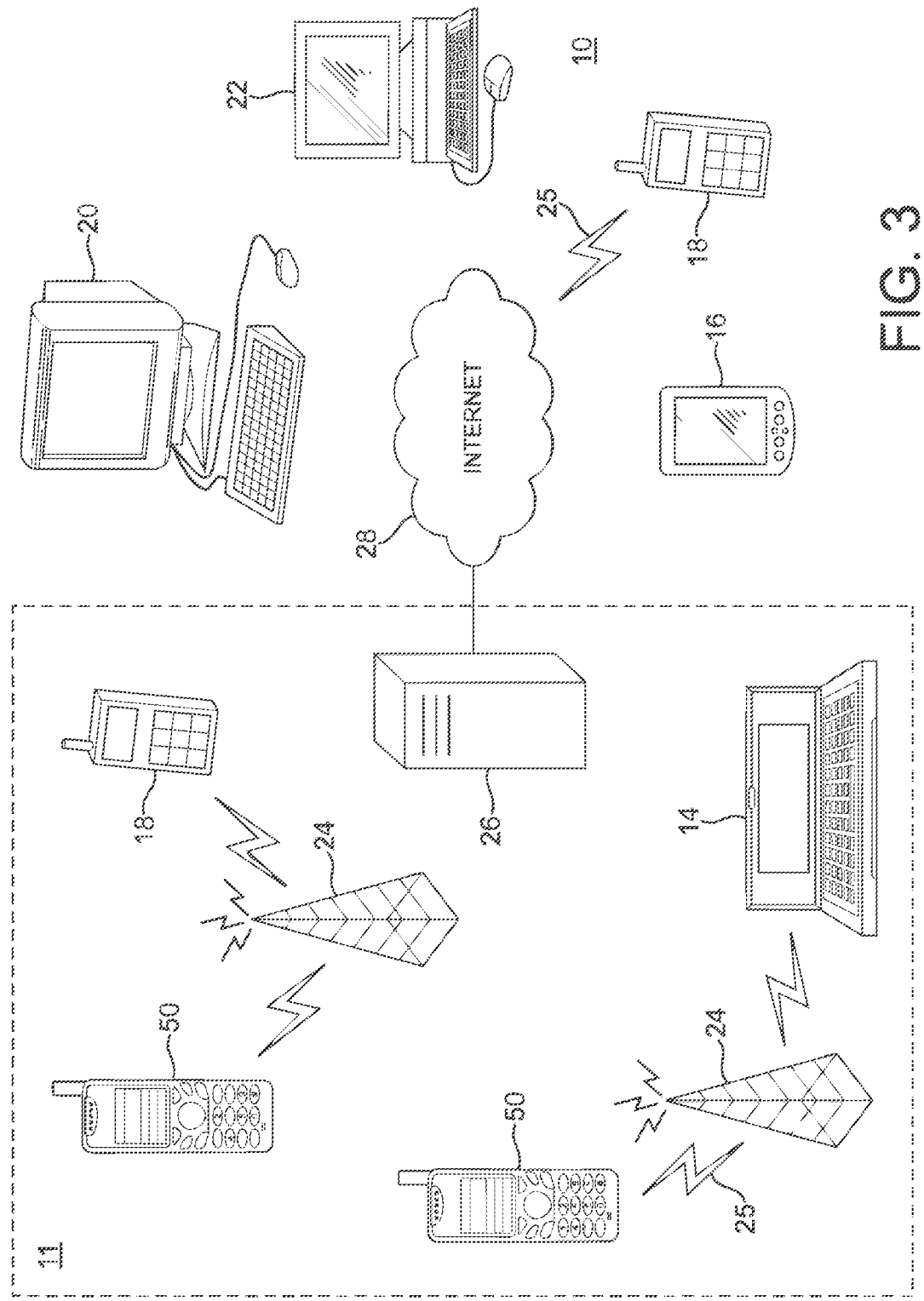
FIG. 3 shows an example of a communication system, wherein a multimedia terminal according to an embodiment can be used.

With respect to FIG. 3, an example of a system within which embodiments of the present invention can be utilized is shown. The system 10 comprises multiple communication devices which can communicate through one or more networks. The system 10 may comprise any combination of wired or wireless networks including, but not limited to a wireless cellular telephone network (such as the global system for mobile communications (GSM) network, 3rd generation (3G) network, 3.5th generation (3.5G) network, 4th generation (4G) network, universal mobile telecommunications system (UMTS), code division multiple access (CDMA) network etc), a wireless local area network (WLAN) such as defined by any of the Institute of Electrical and Electronic Engineers (IEEE) 802.x standards, a bluetooth personal area network, an ethernet local area network, a token ring local area network, a wide area network, and the Internet.

For example, the system shown in FIG. 3 shows a mobile telephone network 11 and a representation of the internet 28. Connectivity to the internet 28 may include, but is not limited to, long range wireless connections, short range wireless connections, and various wired connections including, but not limited to, telephone lines, cable lines, power lines, and similar communication pathways.

The example communication devices shown in the system 10 may include, but are not limited to, an electronic device or apparatus 50, a combination of a personal digital assistant (PDA) and a mobile telephone 14, a PDA 16, an integrated messaging device (IMD) 18, a desktop computer 20, a computer operating as a network server 22. The apparatus 50 may be stationary or mobile when carried by an individual who is moving. The apparatus 50 may also be located in any mode of transport, such as a vehicle.

Some or further apparatus may send and receive calls and messages and communicate with service providers through a wireless connection 25 to a base station 24. The base station 24 may be connected to a network server 26 that allows communication between the mobile telephone network 11 and the internet 28. The system may include additional communication devices and communication devices of various types.

The communication devices may communicate using various transmission technologies including, but not limited to, code division multiple access (CDMA), global systems for mobile communications (GSM), universal mobile telecommunications system (UMTS), time divisional multiple access (TDMA), frequency division multiple access (FDMA), transmission control protocol-internet protocol (TCP-IP), short messaging service (SMS), multimedia messaging service (MMS), email, instant messaging service (IMS), Bluetooth, IEEE 802.11 and any similar wireless communication technology. A communications device involved in implementing various embodiments of the present invention may communicate using various media including, but not limited to, radio, infrared, laser, cable connections, and any suitable connection.

The embodiments described below relate to multimedia communication, such as the 3GPP MTSI service (Multimedia Telephony Service for IMS); (IMS, IP Multimedia Subsystem), described further in detail in 3GPP TS 26.114, v. 11.1.0, "IP Multimedia Subsystem (IMS); Multimedia telephony; Media handling and interaction" (available at http://www.3gpp.org/ftp/Specs/html-info/26114.htm). In particular the embodiments relate to improving voice and video quality in multimedia communications. Ensuring high quality voice and video over transmission channels with limited bit-rate resources and over erroneous channels provides still challenges for today's mobile systems, especially as the quality expectations of customers are continuously increasing.

It is generally known that background noise causes challenges for audio coding and for the overall quality-of-experience in mobile multimedia communications. Audio codecs are typically optimized for voice, since it is their primary application, and therefore they do not always handle background noise particularly well, especially at low bit-rates and for high levels of background noise. Even with modern audio codecs, such as the 3GPP EFR (Enhanced Full Rate), AMR (Adaptive Multi Rate) and AMR-WB (AMR Wideband) the presence of high-level background noise may cause reduced voice quality and even loss of intelligibility. Multimedia terminals are also often used in surroundings with high background noise levels making communication vulnerable to background noise. Multimedia terminals must hence be robust against background noise and therefore noise suppression is typically applied as a pre-processing step before the voice signal is subjected to audio encoding.

Since noise suppression removes part of the "true" signal as captured by the microphones, its use has some inherent challenges. For example, noise suppression can never perfectly distinguish between the voice component and the background noise component. The design and use of a noise suppressor therefore always involves a trade-off between attenuating the background noise as much as possible and causing as little degradation for the voice signal itself. A fixed trade-off between these two is not optimal. Using a high level of attenuation in noise suppression may efficiently reduce the background noise, but it may also colorize the voice component and make it sound unnatural and/or make the background noise component sound unnatural.

Moreover, in some multimedia capturing session it may be desirable that also the ambience, such as music, is conveyed as well as possible. Nevertheless, when applied to non-voice signals, such as music, noise suppression may cause particularly significant quality degradation. At the worst, noise suppression may interpret some parts of the music or other non-voice signals as noise and start muting them.

Figure 4:
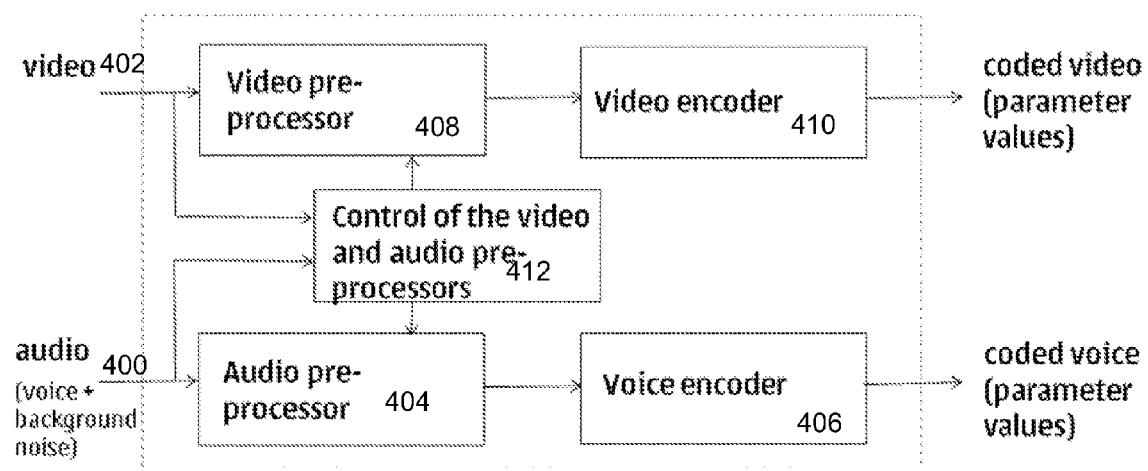
FIG. 4 shows a block diagram of a system according to an embodiment.

FIG. 4 shows a block diagram of a system according to an aspect of the invention. The block diagram illustrates the functional blocks of a multimedia terminal (such as used for 3GPP MTSI) where the audio and video encoding and any related pre-processing are carried out. For carrying out the processing of the multimedia capturing comprising both audio signal and video signal, the audio signal 400 is supplied to its respective processing chain and the video signal 402 is supplied to its respective processing chain. The audio signal 400 may comprise, for example, a voice component and a background noise component. The processing chain of the audio signal comprises at least an audio pre-processor 404, such as a noise suppressor, and an audio encoder 406. The audio pre-processor 404 is arranged to modify the audio signal to become easier to encode by removing the less essential or unnecessary parts, such as noise components, before the audio encoding takes place.

The audio encoder 406 may be any known audio encoder, such as EFR/FR/HR speech codecs ((Enhanced) Full/Half Rate Codec) and Narrowband AMR or Wideband AMR speech codecs (Adaptive Multirate Codec) known per se from 3GPP systems, and codecs used in MPEG1, MPEG2 and MPEG4 audio coding, such as an AAC codec (Advanced Audio Coding), which are suitable for encoding/decoding different audio formats. The term audio encoder thus refers both to audio codecs in the traditional sense and to speech codecs used in different systems and codecs with a scalable bit rate, such as CELP+AAC according to MPEG4.

In a similar manner, the processing chain of the video signal comprises at least a video pre-processor 408 and a video encoder 410. The video pre-processor 408 may be arranged to modify the video signal, for example by smoothening details of the image frames, adjustment of dynamic range of colours, reducing the colour gamut of the video signal or removing the less essential parts of the video signal. The video pre-processor 408 may utilise, for example, various filtering methods and noise reduction processes, known as such, for modifying the video signal before the video encoding.

The video encoder 410 may be any known video encoder, such as a video encoder according to ITU-T H.261, ISO/IEC MPEG-1 Visual, ITU-T H.262 or ISO/IEC MPEG-2 Visual, ITU-T H.263, ISO/IEC MPEG-4 Visual and ITU-T H.264 (also known as H.264/AVC (Advanced Video Coding). In addition, there are currently efforts underway to develop new video coding standards. One such standard under development is High Efficiency Video Coding (HEVC), a successor to H.264/MPEG-4 AVC, which is also referred to as H.265.

Thus, the processing of the audio signal 400 is carried out in its own processing chain and the processing of the video signal 402 is carried out in its respective processing chain. Now a control block 412 is introduced, which is arranged to obtain control information based on either of the audio signal 400 or the video signal 402 or both. The control block 412 may be arranged to supply the control information obtained from the video signal to the audio pre-processor 404, which is arranged to control the pre-processing of the audio signal based on the control information obtained from the video signal. Alternatively or in addition, the control block 412 may be arranged to supply the control information obtained from the audio signal to the video pre-processor 408, which is arranged to control the pre-processing of the video signal based on the control information obtained from the audio signal.

Once the desired pre-processing has been carried out, the audio signal and video signal are encoded by their respective encoders 406, 410, both resulting in encoded parameter values as the output of the encoders. The encoded parameter values of both the audio signal and the video signal are transferred further in the processing chain to be reproduced in a time-synchronized manner, for example during a multimedia call or a playback from a memory medium.

For the sake of simplifying the illustration, FIG. 4 shows the control block 412 as using the unprocessed audio 400 and/or video signal 402 as the basis for obtaining the control information. However, the actual implementation is not limited to the unprocessed signals only, but information may be obtained from any point of the processing chain, as will be described more in detail below.

In the system according to FIG. 4, the pre-processing of the video and the audio can be controlled simultaneously, wherein the control is based on the incoming audio and video signals. Nevertheless, the system according to FIG. 4 also enables to control the pre-processing of the video and the audio independently of each other.

Figure 5:
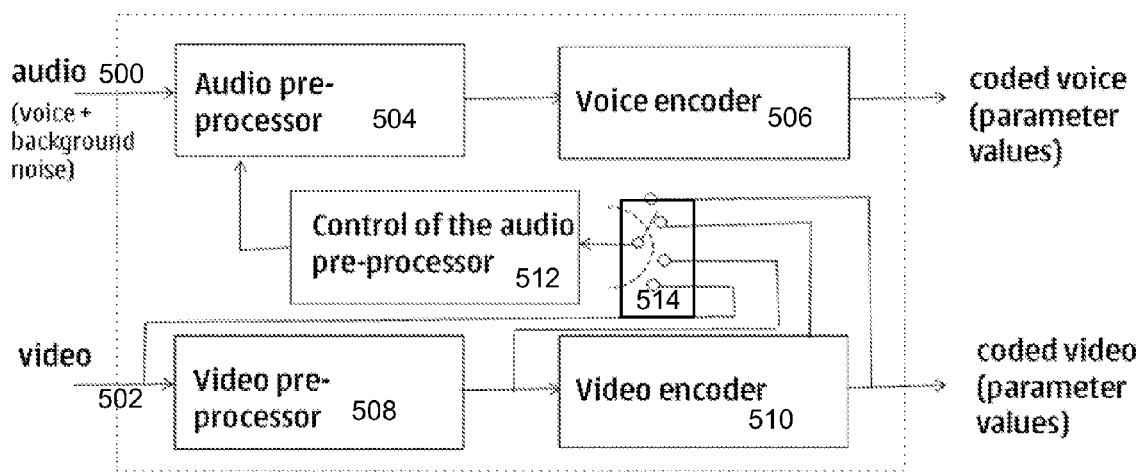
FIG. 5 shows a block diagram of a system for controlling the pre-processing of the audio signal based on the control information obtained from the video signal according to an embodiment.

The embodiments of controlling the pre-processing of the audio signal based on the control information obtained from the video signal are now further described by referring to FIG. 5. Herein, the implementation is otherwise similar to FIG. 4, but the control signal from the audio signal towards the pre-processing of the video signal is ignored from the contemplation. Moreover, information for the audio pre-processor control signal may be obtained from a plurality of points of the processing chain of the video signal. FIG. 5 shows at least four points within the processing chain which may serve as control information supply points: prior to video signal pre-processing, prior to video signal encoding, during video encoding and the encoded parameter values of the video signal.

The audio pre-processing 504 may be any audio pre-processing method intended to modify the audio signal to make it easier for the audio encoder 506 to handle. According to an embodiment, the audio pre-processing is a voice-specific pre-processing, such as noise suppression or any other processing removing less essential or unnecessary parts of the audio signal, voice level adjustment, adjustment of dynamic range of voice, or directing a microphone beamform of a multi-microphone arrangement towards a speaker's mouth, which is intended to modify the voice signal to make it easier for the audio codec to be appropriately processed.

The control block 512 determines the control information on the basis of the video signal. The video signal from a camera unit, the pre-processed video signal, parameters obtained from within the video encoding or the encoded parameter values representing the video signal may be employed in determining the control information of the audio pre-processing 504. A switch arrangement 514 may be provided in connection with the control block 512 to allow the control block to decide the one or more control information supply points to be used.

Noise suppression is typically based on estimation of signal-to-noise ratio (SNR) and then attenuating the portions of signal with low SNR. The attenuation is usually carried out in the frequency domain rather than in the time domain so that different spectral regions may be treated differently. Each frequency or frequency region may be subjected to a different amount of attenuation. The transformation to frequency domain may be carried out by using filter banks or time-frequency transforms such as Fast Fourier Transform (FFT) or Discrete Fourier Transform (DFT).

According to an embodiment, the noise suppression may be based on a noise suppression algorithm described in EP 1 232 496 B1. Adjusting the level of attenuation for background noise in noise suppression may be done directly by adjusting the gain factors that modify the signal (in time or frequency domain), such as those employed in 'multiply with gain' block 330 in EP 1 232 496 to modify the complex FFT spectrum, or indirectly by adjusting the mechanism that determines the gain values rather than by touching the gain values themselves. Such indirect ways include adjusting the signal-to-noise (SNR) estimation to overestimate or underestimate the SNR resulting in less or more attenuation applied in the noise suppression, respectively. Another indirect way of modifying the level of attenuation is to adjust the noise suppression so that it attenuates not only stationary noise but also non-stationary noise. This may be achieved e.g. by updating the SNR estimate more frequently and, consequently, updating the gain values (that are calculated based on the SNR) more often. This results into more aggressive noise suppression which is at its best able to cope also with fast changes in background noise and hence will generally attenuate the background noise more over time.

Figures 6A, 6B, 6C:
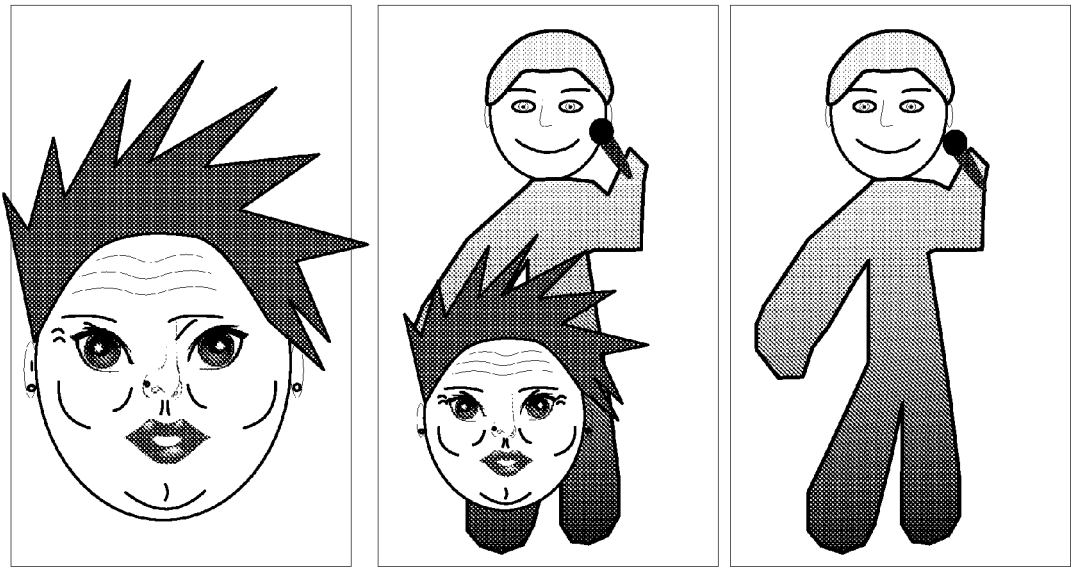
FIGS. 6a, 6b and 6c show an example of controlling the pre-processing of audio based on the video component.

FIGS. 6a, 6b and 6c show an illustrative example of how the audio pre-processing in the embodiment of FIG. 5 may be controlled based on the video component. Let us suppose that the audio pre-processing method is, for example, noise suppression. According to an embodiment, the video component may be utilized in controlling the audio pre-processing such that all sounds that are being produced at each time instant by any object seen on the video scene of the multimedia capture are part of the desired signal to be captured for the particular time instant. Thus, such sound sources may not be considered as sources of noise and therefore no or only minimal noise suppression should be applied to audio signal components originating from such sound sources. However, all sounds that are produced by any object not seen on the video scene of the multimedia capture may be considered as sources of background noise and should be attenuated to improve the clarity of the audio.

According to an embodiment, the above principle of controlling the audio pre-processing, such as the noise suppression, can be applied to practice such the noise suppression to applied to the background noise is increased as a proportion to an image area of a face seen on the video scene. The embodiment derives from a presumption that the face seen on the video scene is the face of the user of the multimedia terminal. Accordingly, the larger the image area of the face appearing on the video scene is, the higher is the level of attenuation applied to the background noise. In addition to the image area, also other factors such as movement of the audio source in the video, and the speed of movement, may be considered in adjusting the level of attenuation.

According to an embodiment, the controlling of the audio pre-processing may be based on priority values determined for the audio sources appearing on a video scene represented by the video signal. Thus, the larger the image area covered by the audio source in said video scene is, the higher is the priority value assigned to said audio source. Then the pre-processing of the audio signal may be adjusted according to the priority value such that an audio component originating from the audio source covering largest image area of the video scene is emphasized in the pre-processing. On the other hand, the priority value may be utilised in adjusting the pre-processing of the audio signal such that an audio component contributing less to an overall video scene, thus having a lower priority value, is de-emphasized in the pre-processing.

Detecting a face from a video scene belongs to the field of pattern recognition, more particularly to image analysis of pattern recognition, wherein pattern recognition algorithms are applied to digital image data in order to recognise features characteristic to a human face. A plurality of algorithms and applications have been developed for automatic recognition of images of human faces. An example of such algorithm for recognition of images of human faces is disclosed in WO2011/091593. It is nevertheless noted that the implementation details of how faces may be detected from the video signal are outside the scope of this invention.

FIGS. 6a, 6b and 6c illustrate still images taken from a video stream of a multimedia capture. The multimedia capture may be for example a video call, wherein the user of the terminal (shown in FIG. 6a) is listening to a music concert of an artist (shown in FIG. 6c). According to the above embodiment, the amount of attenuation in noise suppression is reduced when going from "6a" to "6b" to "6c". Consequently, the user of the multimedia terminal is able increase the amount of noise attenuation simply by pointing the camera of the multimedia terminal to him/herself and moving it closer, hence improving the voice clarity in noisy conditions (i.e. going from "6c" to "6b" to "6a"). On the other hand, by pointing the camera to objects further away from the terminal, such as to the artist shown in FIG. 6c, the amount of noise attenuation is decreased and the ambience considered essential by the user (e.g. music in a live concert) may be conveyed as well as possible.

Consequently, the level of attenuation in noise suppression (or any other audio pre-processing) may be dynamically adjusted by the user of the multimedia terminal. There is no fixed trade-off as a compromise between attenuating background noise and minimising possibility to cause degradation for the voice signal itself, but the noise suppression may be adapted based on the context of the multimedia capture. The ambience is conveyed as well as possible when needed (e.g. music in case "6c") by applying only little or no noise suppression, while for a "person speaking" context (case "6a") the background noise will be more strongly attenuated to improve the clarity and intelligibility of voice.

Similarly, to obtain an improved video quality, any pre-processing to remove or smooth away less significant parts of the video, thus enabling the video coding to focus on the more significant/essential parts of the signal, may be dynamically adjusted during the multimedia capture, such as a multimedia call, based on the context of the capture. The audio component of multimedia capture may be used to determine the context.

Figure 7:
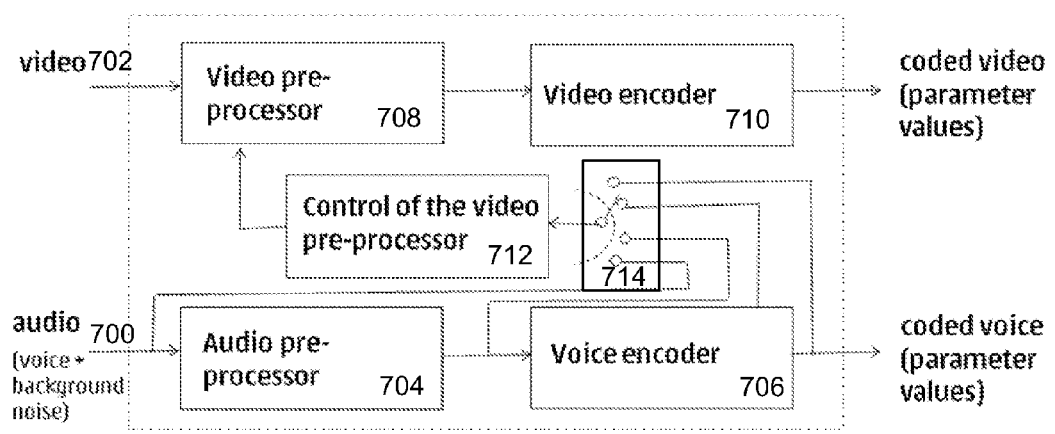
FIG. 7 shows a block diagram of a system for controlling the pre-processing of the video signal based on the control information obtained from the audio signal according to an embodiment.

The embodiments of controlling the pre-processing of the video signal based on the control information obtained from the audio signal are now further described by referring to FIG. 7. Herein, the implementation is otherwise similar to the general idea of FIG. 4, but the control signal from the video signal towards the pre-processing of the audio signal is ignored from the contemplation. Similarly to FIG. 5, information for the video pre-processor control signal may be obtained from a plurality of points of the processing chain of the audio signal. FIG. 7 shows at least four points within the processing chain which may serve as control information supply points: prior to audio signal pre-processing, prior to audio signal encoding, during audio encoding and the encoded parameter values of the audio signal.

The video pre-processing 708 may be any video pre-processing method intended to modify the video signal to make it easier for the video encoder 710 to focus on the more important and essential parts of the video signal. The less essential parts at each time instant are those objects on the video scene that do not contribute to the audio signal (such as people not speaking), and the more essential parts at each time instant are those that do contribute to the audio (such as people who speak and any objects in the video signal contributing an audio component to the overall audio signal).

According to an embodiment, in a similar manner as disclosed above in the controlling of the audio pre-processing, also the controlling of the video pre-processing may be based on priority values determined for the audio sources appearing on a video scene represented by the video signal. Thus, the more significant an audio component contributed by an object appearing on a video scene to an overall audio scene is, the higher is the priority value assigned to said object. Then the pre-processing of the video signal may be adjusted according to the priority value such that an object contributing less to an overall audio scene, thus having a lower priority value, is de-emphasized in the pre-processing.

According to an embodiment, for determining the objects on the video scene that do contribute to the audio signal, the direction of arrival (DOA) of the audio component can be estimated. For determining the DOA, a directional microphone array consisting of two or more microphones, preferably mounted on the device could be used. Typically, the use of e.g. 3, 4, 5 or more microphones provides improved directional selectivity. Instead or in addition to a microphone mounted on the user device, an external microphone which is functionally connected to the user device may also be used for capturing the audio signal. Once the DOA of an audio component has been estimated, it can be compared to the objects on the video scene, and the video pre-processor control signal may then be generated such that a suitable video pre-processing is applied to the object contributing the audio component.

In estimating the DOA of the audio component, a generally known technique referred to as beamforming can be utilised, wherein the DOA of the audio source can be extracted using so-called beamforming algorithms. The beamforming algorithms may estimate the DOA of a sound source, for example, by comparing the delays of arrival of a particular audio component value in each microphone line. According to another embodiment, the multi microphone beamformer may be applied in detecting the audio source location by searching for the direction that maximises the microphone array output energy, thus indicating the most dominant audio component.

According to an embodiment, for determining the objects on the video scene that do contribute to the audio signal, the captured audio components may be subjected to an information extraction. An example of information that can be extracted is a pattern (for example in a form of a vector) that characterizes the temporal spectral components of the audio segment and/or signal level characteristics. This time-frequency pattern can advantageously be utilized to classify the captured audio components. For example, the captured audio components can be classified as coming from a human, a car, an animal or any other audio source.

The classification can be done by comparing the detected pattern with a set of patterns stored in advance into the device using, for example, a speech recognition engine. Another example of an audio content classification is a context recognition engine, which is disclosed more in detail in the publication "Audio-based context recognition", Eronen A et al., IEEE Transactions on audio, speech and language processing, Vol. 14. No 1, January 2006.

Figure 8A:
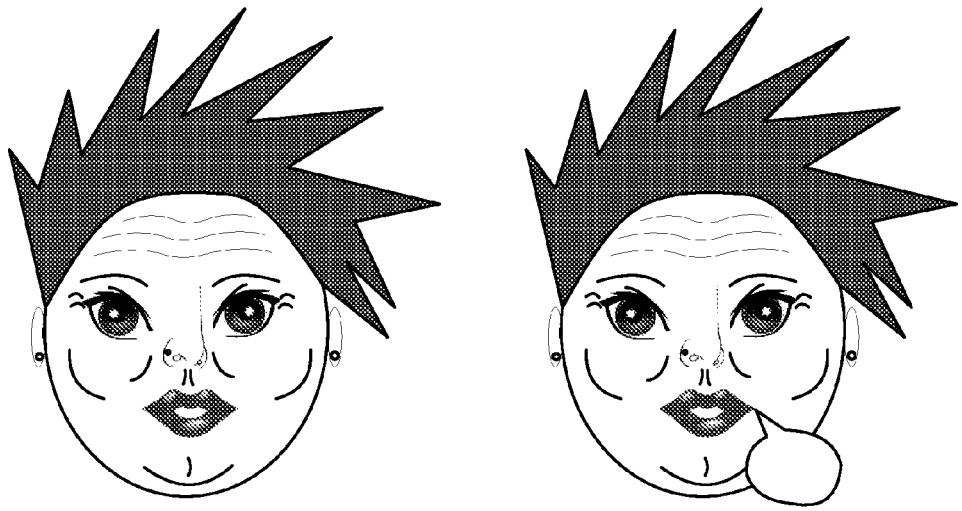
FIGS. 8a and 8b show an example of controlling the pre-processing of video based on the audio component.
Figure 8B:
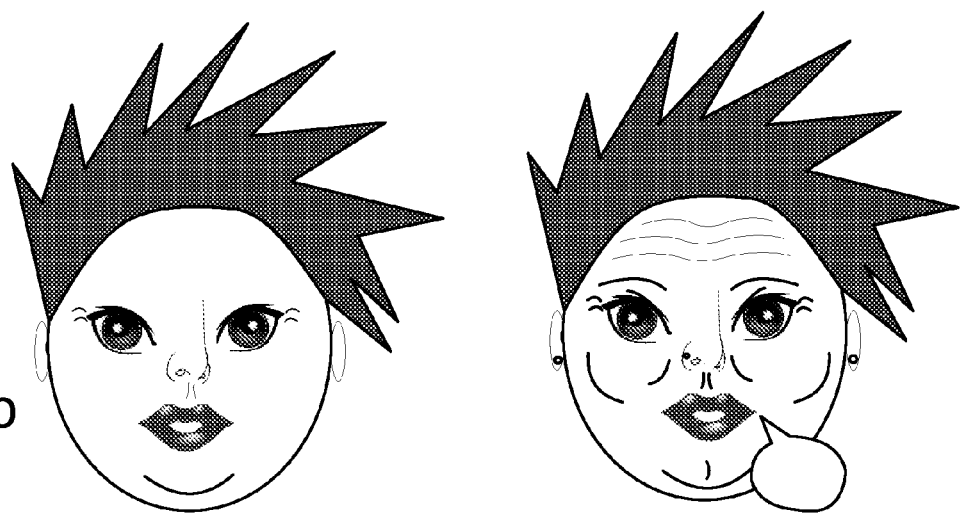

The above embodiments are illustrated in FIGS. 8a and 8b, which show an example of how the pre-processing of video in the embodiment of FIG. 7 may be controlled based on the audio component. The video scene of the multimedia capture involves two persons speaking in turns. Both speakers may, for example, be moving in the video scene, whereby substantial bit-rate may be required in the video coding. Thus, it could be desirable to reduce the complexity of the video coding by remove non-essential parts of the video scene. In FIGS. 8a and 8b the active speaker at the given moment is the one on the right (as pointed out by the balloon; not part of the actual video signal) and the non-active speaker is the one on the left.

FIG. 8a illustrates the video scene contained in the video signal at the input of the video pre-processing 708; i.e. prior to applying the pre-processing. When the video pre-processing 708 is applied to the video signal according to the control information obtained from the audio signal, the video pre-processing 708 removes details from the video signal of the non-active speaker. The result is shown in FIG. 8b, wherein some details on the face of the non-active speaker have been removed, which in turn enables the video signal for the active speaker to be encoded with increased bit-rate and precision.

Figure 9:
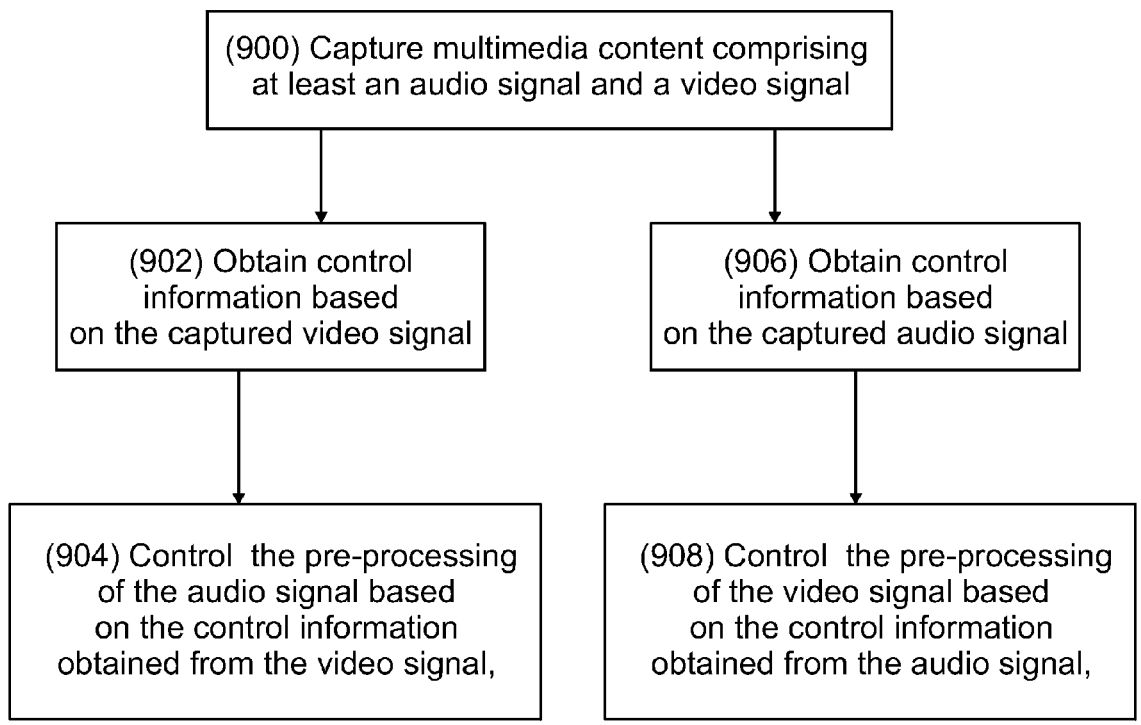
FIG. 9 shows a flow chart of the method for controlling capturing of multimedia content according to an embodiment.

FIG. 9 shows a flow chart of the method for controlling capturing of multimedia content according to an embodiment. As a first step (900), multimedia content comprising at least an audio signal and a video signal is captured by an apparatus. The apparatus may be, for example, a multimedia terminal used for 3GPP MTSI and the multimedia capturing may relate, for example, to a video call.

The apparatus may obtain control information (902) based on the captured video signal, for example, according to any of the embodiments described above. Then, based on the control information obtained from the video signal, the pre-processing of the audio signal is controlled (904) to modify the audio signal to make it easier for an audio encoder of the apparatus to handle.

Alternatively, or in addition, the apparatus may obtain control information (906) based on the captured audio signal, for example, according to any of the embodiments described above. Then, based on the control information obtained from the audio signal, the pre-processing of the video signal is controlled (908) to modify the video signal to enable a video encoder of the apparatus to focus on the more significant/essential parts of the video signal.

After the pre-processing, the audio signal is transferred to the audio encoder to be encoded (not shown) and the video signal is transferred to the video encoder to be encoded (not shown).

Thus, in the method according to FIG. 9, it is possible to carry out the control of only either of the pre-processing of the video or the audio; i.e. only steps 902 and 904 or steps 906 and 908. Naturally, it is possible to carry out the control of the pre-processing of both the video and the audio, either simultaneously or independently of each other.

A skilled man appreciates that any of the embodiments described above may be implemented as a combination with one or more of the other embodiments, unless there is explicitly or implicitly stated that certain embodiments are only alternatives to each other.

The various embodiments may provide advantages over state of the art. The embodiments may provide improved quality for multimedia captures, especially for multimedia calls, through improved audio quality, improved video quality, or both. The improved quality may be achieved even without increasing the bit-rate. Especially, in regard to the improvements in the audio quality, the magnitude of any voice-specific pre-processing, such as the level of attenuation applied in background noise suppression, may be dynamically adjusted instead of being fixed. The dynamic adjustment may be carried out by the user of multimedia terminal simply by the way how he/she uses the camera of the terminal. Moreover, the embodiments provide a viable framework to easily incorporate cross-media adjustment for multimedia communication systems and services. Since standardized voice and video codecs are typically used in commercial telecommunication systems, such as 3GPP MTSI, the embodiments enable to incorporate cross-media adjustment for the overall media coding, especially for already existing systems, such as 3GPP MTSI.

In general, the various embodiments of the invention may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

The embodiments of this invention may be implemented by computer software executable by a data processor of the mobile device, such as in the processor entity, or by hardware, or by a combination of software and hardware. Further in this regard it should be noted that any blocks of the logic flow as in the Figures may represent program steps, or interconnected logic circuits, blocks and functions, or a combination of program steps and logic circuits, blocks and functions. The software may be stored on such physical media as memory chips, or memory blocks implemented within the processor, magnetic media such as hard disk or floppy disks, and optical media such as for example DVD and the data variants thereof, or CD.

The memory may be of any type suitable to the local technical environment and may be implemented using any suitable data storage technology, such as semiconductor based memory devices, magnetic memory devices and systems, optical memory devices and systems, fixed memory and removable memory. The data processors may be of any type suitable to the local technical environment, and may include one or more of general purpose computers, special purpose computers, microprocessors, digital signal processors (DSPs) and processors based on multi core processor architecture, as non limiting examples.

Embodiments of the inventions may be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

Programs, such as those provided by Synopsys, Inc. of Mountain View, Calif. and Cadence Design, of San Jose, Calif. automatically route conductors and locate components on a semiconductor chip using well established rules of design as well as libraries of pre stored design modules. Once the design for a semiconductor circuit has been completed, the resultant design, in a standardized electronic format (e.g., Opus, GOSH, or the like) may be transmitted to a semiconductor fabrication facility or "fab" for fabrication.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention.

The invention claimed is:

1. A method, comprising:
   capturing multimedia content by an apparatus, said multimedia content comprising at least an audio signal and a video signal;
   obtaining control information based on at least either of said audio signal or video signal;
   controlling pre-processing of the audio signal based on the control information obtained from the video signal; and/or
   controlling pre-processing of the video signal based on the control information obtained from the audio signal.

2. A method according to claim 1, wherein
   the pre-processing of the audio signal is one of the following: noise suppression, voice level adjustment, adjustment of dynamic range of voice, directing a microphone beamform of a multi-microphone arrangement towards an audio source.

3. A method according to claim 1, the method further comprising
   determining a priority value for at least one audio source appearing on a video scene represented by the video signal in proportion to an image area covered by the audio source in said video scene; and
   adjusting the pre-processing of the audio signal according to the priority value such that an audio component originating from an audio source covering largest image area of the video scene is emphasized in the pre-processing.

4. A method according to claim 1, the method further comprising
   determining a priority value for at least one audio source appearing on a video scene represented by the video signal in proportion to an image area covered by the audio source in said video scene; and
   adjusting the pre-processing of the audio signal according to the priority value such that an audio component contributing less to an overall video scene is de-emphasized in the pre-processing.

5. A method according to claim 1, the method further comprising
   detecting at least a part of a human face in a video scene represented by the video signal; and
   adjusting the pre-processing of the audio signal in proportion to an image area covered by the human face in said video scene.

6. A method according to claim 5, wherein said pre-processing of the audio signal is noise suppression, and the method further comprises
   adjusting attenuation of background noise in proportion to the image area covered by the human face in said video scene.

7. A method according to claim 1, the method further comprising
   obtaining control information for the audio pre-processor control signal from a plurality of points of a processing chain of the video signal, said plurality of points being located in at least one of the following points: prior to video signal pre-processing, prior to video signal encoding, during video encoding and the encoded parameter values of the video signal.

8. A method according to claim 1, wherein
   the pre-processing of the video signal is one of the following: smoothening details of image frames, adjustment of dynamic range of colours, reducing a colour gamut of the video signal or removing less essential parts of the video signal.

9. A method according to claim 1, the method further comprising
   determining a priority value for at least one object appearing on a video scene represented by the video signal in proportion to an audio component contributed by said object to an overall audio scene; and
   adjusting the pre-processing of the video signal according to the priority value such that an object contributing less to an overall audio scene is de-emphasized in the pre-processing.

10. An apparatus comprising at least one processor, memory including computer program code, the memory and the computer program code configured to, with the at least one processor, cause the apparatus to at least:
   capture multimedia content, said multimedia content comprising at least an audio signal and a video signal;
   obtain control information based on at least either of said audio signal or video signal;
   control pre-processing of the audio signal based on the control information obtained from the video signal; and/or
   control pre-processing of the video signal based on the control information obtained from the audio signal.

11. An apparatus according to claim 10, wherein
the pre-processing of the audio signal is one of the following: noise suppression, voice level adjustment, adjustment of dynamic range of voice, directing a microphone beamform of a multi-microphone arrangement towards an audio source.

12. An apparatus according to claim 10, further comprising computer program code configured to, with the at least one processor, cause the apparatus to at least:
determine a priority value for at least one audio source appearing on a video scene represented by the video signal in proportion to an image area covered by the audio source in said video scene; and
adjust the pre-processing of the audio signal according to the priority value such that an audio component originating from an audio source covering largest image area of the video scene is emphasized in the pre-processing.

13. An apparatus according to claim 10, further comprising computer program code configured to, with the at least one processor, cause the apparatus to at least:
determine a priority value for at least one audio source appearing on a video scene represented by the video signal in proportion to an image area covered by the audio source in said video scene; and
adjust the pre-processing of the audio signal according to the priority value such that an audio component contributing less to an overall video scene is de-emphasized in the pre-processing.

14. An apparatus according to claim 10, further comprising computer program code configured to, with the at least one processor, cause the apparatus to at least:
detect at least a part of a human face in a video scene represented by the video signal; and
adjust the pre-processing of the audio signal in proportion to an image area covered by the human face in said video scene.

15. An apparatus according to claim 14, wherein said pre-processing of the audio signal is noise suppression, and the apparatus further comprising computer program code configured to, with the at least one processor, cause the apparatus to at least:
adjust attenuation of background noise in proportion to the image area covered by the human face in said video scene.

16. An apparatus according to claim 10, further comprising computer program code configured to, with the at least one processor, cause the apparatus to at least:
obtain control information for the audio pre-processor control signal from a plurality of points of a processing chain of the video signal, said plurality of points being located in at least one of the following points: prior to video signal pre-processing, prior to video signal encoding, during video encoding and the encoded parameter values of the video signal.

17. An apparatus according to claim 10, wherein
the pre-processing of the video signal is one of the following: smoothening details of image frames, adjustment of dynamic range of colours, reducing a colour gamut of the video signal or removing less essential parts of the video signal.

18. An apparatus according to claim 10, further comprising computer program code configured to, with the at least one processor, cause the apparatus to at least:
determine a priority value for at least one object appearing on a video scene represented by the video signal in proportion of an audio component contributed by said object to an overall audio scene; and
adjust the pre-processing of the video signal according to the priority value such that an object contributing less to an overall audio scene is de-emphasized in the pre-processing.

19. A non-transitory computer readable storage medium tangibly encoded with a computer program executable, which when executed by a processor of an apparatus, causes the apparatus to perform:
capturing multimedia content, said multimedia content comprising at least an audio signal and a video signal;
obtaining control information based on at least either of said audio signal or video signal;
controlling pre-processing of the audio signal based on the control information obtained from the video signal; and/or
controlling pre-processing of the video signal based on the control information obtained from the audio signal.

20. An apparatus comprising:
means for capturing multimedia content, said multimedia content comprising at least an audio signal and a video signal;
means for obtaining control information based on at least either of said audio signal or video signal;
means for controlling pre-processing of the audio signal based on the control information obtained from the video signal; and/or
means for controlling pre-processing of the video signal based on the control information obtained from the audio signal.

* * * * *